US008522620B2

(12) United States Patent
Koehler et al.

(10) Patent No.: US 8,522,620 B2
(45) Date of Patent: Sep. 3, 2013

(54) PRESSURE SENSOR AND USE THEREOF IN A FLUID TANK

(75) Inventors: Jens Koehler, Thiendorf (DE); Lars Petersen, Dresden (DE); Sebastian Hagedorn, Dresden (DE)

(73) Assignee: Silicon Micro Sensors GmbH, Dresden (DE)

( * ) Notice: Subject to any disclaimer, the term of this patent is extended or adjusted under 35 U.S.C. 154(b) by 377 days.

(21) Appl. No.: 12/905,283

(22) Filed: Oct. 15, 2010

(65) Prior Publication Data
US 2011/0088480 A1      Apr. 21, 2011

(30) Foreign Application Priority Data
Oct. 16, 2009   (DE) .................. 10 2009 049 770

(51) Int. Cl.
*G01L 9/00* (2006.01)

(52) U.S. Cl.
USPC ............. 73/753; 73/715; 73/754; 361/283.4

(58) Field of Classification Search
None
See application file for complete search history.

(56) References Cited

U.S. PATENT DOCUMENTS

| | | | | |
|---|---|---|---|---|
| 4,314,225 | A * | 2/1982 | Tominaga et al. | 338/4 |
| 4,726,233 | A * | 2/1988 | Eckardt et al. | 73/727 |
| 4,965,777 | A * | 10/1990 | Timossi et al. | 367/140 |
| 5,824,891 | A * | 10/1998 | Monson | 73/146.5 |
| 6,536,287 | B2 * | 3/2003 | Beekhuizen et al. | 73/718 |
| 6,584,851 | B2 * | 7/2003 | Yamagishi et al. | 73/715 |
| 6,609,427 | B1 * | 8/2003 | Schnaare et al. | 73/753 |
| 6,672,170 | B1 * | 1/2004 | DiPaola | 73/717 |
| 6,694,818 | B2 * | 2/2004 | Chikuan et al. | 73/715 |
| 6,715,357 | B2 * | 4/2004 | Ishiguro et al. | 73/715 |
| 6,742,397 | B2 * | 6/2004 | Parker | 73/756 |
| 6,883,380 | B2 * | 4/2005 | Romo | 73/729.2 |
| 6,889,554 | B2 * | 5/2005 | Hirota et al. | 73/719 |
| 6,978,678 | B2 * | 12/2005 | Lohmeier et al. | 73/721 |
| 7,024,737 | B2 | 4/2006 | Schuh et al. | |
| 7,073,375 | B2 * | 7/2006 | Parker et al. | 73/114.76 |
| 7,152,477 | B2 * | 12/2006 | Banholzer et al. | 73/700 |
| 7,159,464 | B2 * | 1/2007 | Tohyama et al. | 73/706 |
| 7,168,325 | B2 * | 1/2007 | Yoshino | 73/754 |
| 7,181,974 | B2 * | 2/2007 | Hegner et al. | 73/724 |
| 7,191,658 | B2 * | 3/2007 | Oda et al. | 73/702 |
| 7,370,536 | B2 * | 5/2008 | Ueyanagi et al. | 73/754 |
| 7,562,580 | B2 * | 7/2009 | Rezgui et al. | 73/716 |
| 7,600,433 | B2 * | 10/2009 | Koehler et al. | 73/756 |
| 7,873,176 | B2 * | 1/2011 | Pavlovic et al. | 381/369 |
| 8,050,443 | B2 * | 11/2011 | Izuchi et al. | 381/357 |

FOREIGN PATENT DOCUMENTS

| | | |
|---|---|---|
| DE | 19731420 A1 | 1/1999 |
| DE | 102005029841 A1 | 3/2006 |
| DE | 102006026881 A1 | 12/2007 |
| JP | 2002162306 A | 6/2002 |

* cited by examiner

*Primary Examiner* — Lisa Caputo
*Assistant Examiner* — Jermaine Jenkins
(74) *Attorney, Agent, or Firm* — Heslin Rothenberg Farley & Mesiti P.C.

(57) ABSTRACT

A pressure sensor in contact with an aggressive fluid for a pressure measurement has a board with a pressure passage. The pressure passage is closed on one side by a sensor chip as a pressure sensing element. The board also mounts an integrated circuit and electrical contacts for electrical contacting of the pressure sensor. At least the on board arranged pressure sensing element as well as the integrated circuit are tightly enclosed by a capper made of a fluid resistant material in connection with the board, and are arranged in an encasing cavity formed by the capper and the board for fluid resistant protection.

11 Claims, 3 Drawing Sheets

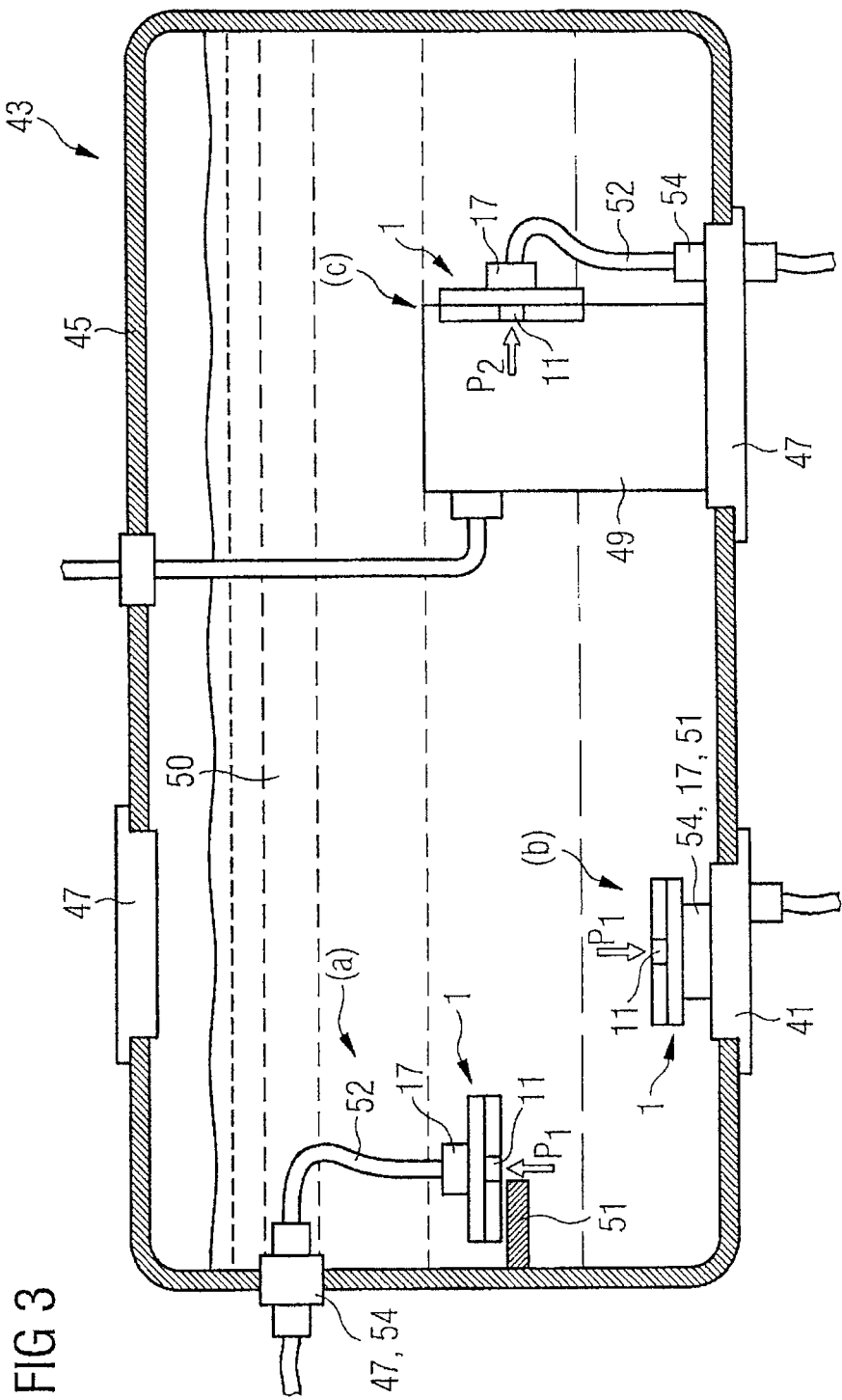

PRESSURE SENSOR AND USE THEREOF IN A FLUID TANK

CROSS REFERENCE TO RELATED APPLICATIONS

This application claims priority of German application No. 10 2009 049 770.6 filed on Oct. 16, 2009, the entire disclosure of which is hereby incorporated herein by reference.

BACKGROUND OF THE INVENTION

The invention refers generally to a pressure sensor as well as the use thereof in a Fluid Tank which serves for the storage and transport of fluids. The invention refers also to a fluid tank with a pressure sensor.

The invention refers in particular to a pressure sensor and the use thereof in the automotive sector wherein the pressure sensor is in contact with an aggressive fluid in a fluid tank. By fluids is meant in general both liquid and gaseous medium.

A pressure sensor comprises as essential components a housing with a pressure passage to which the medium is applied of which the pressure is to be measured. The known pressure sensors have normally as a pressure passage a pressure port extending into the housing. The pressure passage or if need be, the pressure port is fitted with a micro-mechanical pressure sensing element (sensor chip) arranged in the housing. The pressure sensing element is arranged in a manner that it closes the pressure passage, so that through this a pressure acts on the pressure sensing element.

Such a pressure sensor is, for instance, described in U.S. Pat. No. 7,024,737 B1. Therein, a pressure sensing element is mounted with the interposition of a glass socket with its membrane above the pressure passage of a pressure port, so that an applied and to be measured pressure in the pressure passage of the pressure port acts on the membrane. On the opposite side of the membrane, which mostly and also in the following is designated as the front side of the pressure sensing element, measuring resistors are arranged to identify the applied pressure or a change in pressure by means of the change in resistance. The change in resistance is, as is known, a result of a deflection of the membrane out of its resting position as a consequence of a change of the applied pressure and the associated tension and pressure loading of the membrane. A first processing of the signal and possible temperature compensations take place using an integrated circuit which is integrated on a ceramics board in the pressure sensor.

Depending on the application, the pressure measurement takes place in different measuring routines, for instance for fluid level measurements either hydrostatically from an atmospheric pressure deviating pressure inside a tank, e.g. the fluid tank, alternatively in an open tank, or as differential pressure. By the latter is meant for instance the measurement of the pressure inside a liquid medium, e.g. at the bottom of a fluid tank, relative to the pressure above the fluid level in comparison to a measurement principle of a single sensor for which the pressure measurement takes place absolutely, i.e. against a in the sensor adjusted vacuum or reference volume, or relatively, i.e. in reference to a known absolute pressure in an open or closed measuring cavity of the sensor. A pressure sensor which uses the first mentioned measurement principle is generally designated as absolute pressure sensor, in latter case as differential pressure sensor, wherein the above described pressurized hydrostatic measurement can principally take place through a suitable design of the measuring cavities with only one pressure sensor.

For measuring pressure, the pressure sensor is in contact with the fluid itself or with its vapors. The materials of the pressure sensor therefore have to be resistant against the various elements of the fluid. For the pressure measurement, e.g. in fuel systems with modern fuel, the resistance is not only necessary against petrol, but also against alcohols such as methanol and ethanol as well as against water. These substances occur mainly through adding alcoholic bio-fuel.

The pressure measurement can be required for the purpose of controlling and/or of monitoring functions in various applications. For instance, the pressure measurement takes place in a fuel delivery module which is arranged in the fluid tank as separable component and among others comprises a fuel pump and a filter. Also in the exhaust system for the regulation of urea injections for the reduction of nitrogen emission, the pressure measurement takes place.

Inside a fluid tank, pressure measurements are used for further purposes. In this way, a pressure sensor in a fluid tank can serve, e.g. as level indicator of the fluid tank, or for diagnosing leaks in the fluid tank system, for the control of the tank ventilation devices to diminish under- or excess-pressure in the fluid tank, or equally to control a restraint system for vapor emissions of the fluid. Also in other spatially to the fluid tank connected components, pressure measurements are required.

Such a fluid tank comprises among further components at least a pressure passage which can be closed via a tank flange, and a pressure sensor for the display of the pressure in the fluid tank. By tank flange, a cap of such tank openings is generally understood which besides the filling opening is inserted in the fluid tank to install components such as, for instance, a fuel delivery module, or to enable inspections.

Because of the aggressive medium coming in contact with the sensor, in current embodiments of the fluid tanks, the associated pressure sensors are designed in a way that apart from the rear side of the membrane only the pressure ports come in contact with the medium. In U.S. Pat. No. 5,621,176 A, a similar pressure sensor for measuring the internal pressure of the fluid tank is described. Such pressure sensors as well as such sensors to indicate fluid levels using the above described hydrostatic differential pressure measurement are mounted on the housing wall of the fluid tank, so that only the pressure port extends into the fluid tank. This construction connects the installation of the pressure sensor with the construction of the tank which amongst others requires higher standards in tightness of the installed components, and in particular of the conditioning and calibration of the sensors during an early installation phase.

SUMMARY OF THE INVENTION

One object of the invention is to provide a pressure sensor usable for pressure measurements in fluid which is cost-effectively and maintenance-friendly integrated in a fluid tank as a compact element.

The pressure sensor described in the following has at least a dual, staggered protection of at least the sensor chip serving as the pressure sensing element, and of the associated integrated circuit to the fluid. The protection is realized through a capper which is connected with the circuit and the sensor chip holding board, and operates in connection to the further devices arranged in the capper which themselves and similar to the capper are resistant to the fluid. The connection of the capper with a board of the pressure sensor is as tight that it can be used as a compact component, i.e. this is inclusive of its electronics for signal evaluation and its electrical contacts, in a fluid in particular inside a fluid tank. Thereby, the pressure sensor is mounted on or in the tank in a way that at least the pressurized side of the sensor chip via the passage in the board, i.e. the pressure passage, and the capper are exposed to the fluid. Alternatively, such an arrangement of the pressure sensor in the fluid is possible, so that the pressure sensor is entirely exposed to the fluid.

For that purpose, the pressure sensor requires none or only a small installation space outside said device in whose interior the pressure measurement shall take place.

Additionally, the compact construction of the pressure sensor simplifies its installation and positioning, so that its location is more variable, and its exchangeability can be better realized than before. In particular, the exchangeability in a fluid tank is realizable by mounting the pressure sensor on a component of the fluid tank which is detachably connected with the fluid tank. As described above, such a component can be a tank flange or a fuel delivery module. The compact construction makes it possible to extend a pressure sensor mounted on a tank flange through the pressure passage into the fluid tank, and to fixate it using the flange. Also a fuel delivery module often presents an independent and exchangeable component of a fluid tank, so that the pressure sensor can be mounted in the module, and this then can be mounted in the tank.

The compact construction allows also the application in several other embodiments in particular in the above presented. Thus, measurements of the pressure in the tank are possible following from the delivery pump and if need be following a filter. Also in these applications, the sensor as a whole is in the fluid, in case of a fuel tank e.g. inside a pressurized chamber deviating from the internal pressure of the tank. Thereby, this pressurized space has an effect on one side of the sensor, on its pressure passage, while the other side is exposed to the internal pressure of the tank. Both sides however are completely surrounded in every case by the fluid.

Through a respective design of the pressure sensing element, the pressure sensor in the fluid can also be designed for both an absolute and differential pressure sensor.

Furthermore, a fluid tank can be presented in which a pressure sensor is integrated which inclusive of its circuitry can be arranged at any location in the fluid tank and thus, also in the fluid. It is merely necessary to extend electrical connections out of the fluid tank to connect the pressure sensor with an external measurement unit. Such lead passages have to be manufactured reliably tight. They can also be prepared at any location in the fluid tank in a way that a simple installation of the pressure sensor is possible. For instance, through a plug connection in the tank housing, a mechanical fixation and at the same time an electrical connection to an external, outside of the fluid tank arranged measurement unit can be formed.

As the pressure sensor is integrated as a single and already fully assembled component, its conditioning according to the respective measuring task and in particular the calibration are possible even before the installation in the fluid tank, so that immediately following the installation of the sensor, measurement signals, also standardized measurement signals can be picked up. The functions immediately available with the installation also affect further components useful for the sensor such as a temperature compensation of the measurement signal inclusive of a temperature sensor.

The pressure sensor described in detail in the following can be used, e.g. for monitoring emission limits wherein the categorization of the pressure sensor as an On-Board-Diagnostic-Sensor can take place in line with the legal requirements. For this use, it can additionally serve the measurement of the internal pressure of the tank or the diagnosis of a tank leakage.

BRIEF DESCRIPTION OF THE DRAWINGS

The invention shall be explained more in detail using embodiments. The respective drawings show in FIG. 1A and FIG. 1B alternative embodiments of a pressure sensor in a horizontal cross-section, FIG. 2A and FIG. 2B a pressure sensor in a vertical cross-section with alternative embodiments of the electrical contacts of the pressure sensor, and FIG. 3 a schematical presentation of a fluid tank with alternative installation situations of the pressure sensor.

DETAILED DESCRIPTION OF THE INVENTION

Figure 1A:
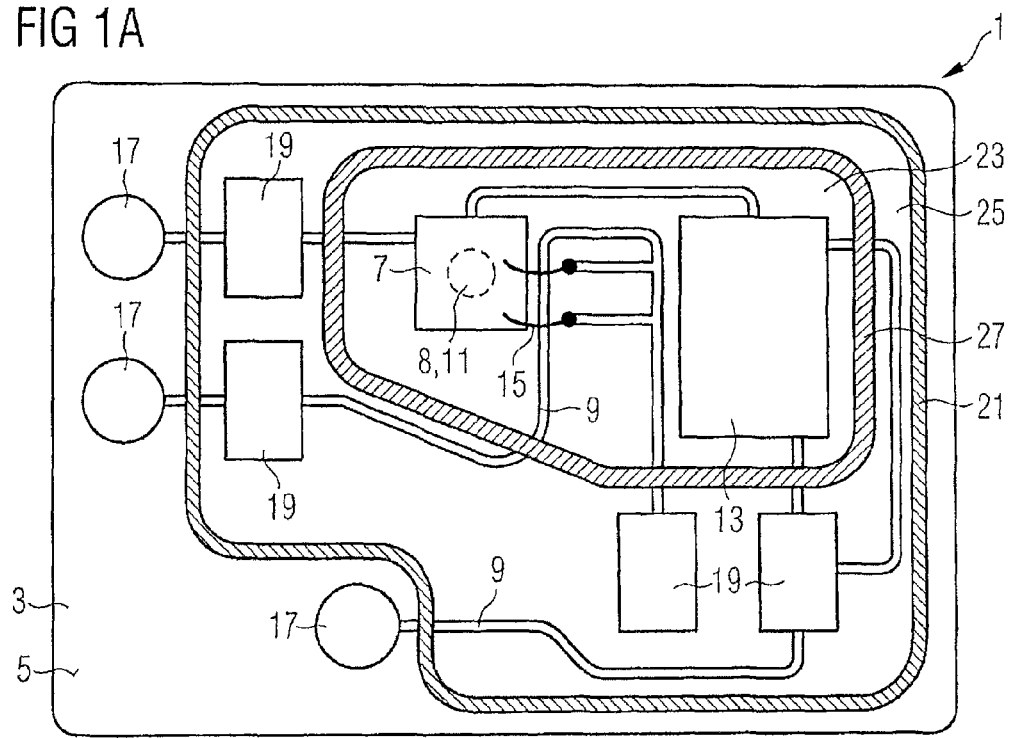

A pressure sensor 1 according to FIG. 1A is illustrated in regards to its use in a fluid tank but not limited to this use.

The pressure sensor 1 presented in FIG. 1A in a horizontal cross-section comprises a board 3 which acts as a circuit carrier and on whose side, in the following designated as front side 5, further components of the pressure sensor 1 are mounted and structures of conductor paths 9 are formed which electrically connect the single components. The designation of the horizontal cross-section shall be no indication to the location of the pressure sensor 1 when assembled, however shall merely serve to distinguish from the cross-sections in FIGS. 2A and 2B. By 'horizontal', a plane parallel to board 3 is meant.

The board 3 consists of a dielectrical material which is resistant to the fluid whose pressure is to be measured and with which the pressure sensor 1 is in contact for that purpose. In the present embodiment, board 3 consists of an aluminium oxide ceramic. Alternatively and depending on the medium in which the pressure sensor 1 is used, other substrates can also be used such as organic substrates, substrates consisting of glass or FR-4, the commonly for circuit boards used materials.

Board 3 has a pressure passage 11. Above the pressure passage 11, a pressure sensing element 7 is attached, so that it closes the pressure passage 11. The pressure sensing element is a micro-mechanical component and semiconductor based. In the present embodiment, it is a piezo-resistive silicon pressure sensing element 7. The installation of the pressure sensing element 7 on board 3 takes place through a suitable connection, e.g. an adhesive joint, wherein through various measures such as treatment of the surface of the board, the adhesiveness of the pressure sensing element 7 on board 3 is adapted to the pressure measuring range. In an alternative embodiment, the pressure sensing element 7 with interposition of a socket, e.g. made of glass can be fitted to board 3.

The in FIG. 1A below the pressure sensing element 7 ending pressure passage 11 is presented by a dashed line. The pressure passage 11 ends at the rear side 6 of board 3, and is when the pressure sensor 1 is assembled open towards the fluid.

The pressure passage 11 and if need be the passage of the socket are closed by the membrane 8 of the pressure sensing element 7. Thus, a fluid applied in the pressure passage 11 acts on the membrane 8 of the pressure sensing element 7. Alternatively, the pressure sensor can also be realized with another suitable pressure sensing element 7.

For signal processing of signals tapped from measuring resistors, a suitable integrated circuit 13, in the described embodiment an ASSP, is mounted on the front side of the board 3. The integrated circuit is electrically connected with the conductor paths 9 of the board 3. In the present embodiment, an electrical connection is generated via a flexible electrical connector 15, here in form of wire jumpers between the measuring resistors (not presented) of the pressure sensing element 7, and via these with the integrated circuit 13. Alternatively, other electrical connections are also possible, e.g. soldering and grouting.

Independent of the integrated circuit 13 used, pressure and temperature signals or further input variables can be measured, as for instance the fluid level of the tank via a resistive transmitter. With a simultaneous transmission of measuring signals via a digital signal path to a control device or another external measuring unit, the amount of the electrical contacts that are to be extended outwardly can be reduced.

Furthermore, on the front side 5 of the board 3, electrical contacts 17 are arranged which are also in electrical contact with the conductor paths 9, and via this with the integrated circuit 13. Via the electrical contacts 17, the through the integrated circuit 13 processed signals of the pressure sensing element 7 can be transmitted to an external, outside of the fluid tank arranged measuring unit.

Additionally, further electronic components 19, e.g. SMD components are mounted on the board 3 and electrically connected via the conductor paths 9 which realize further functional features of the pressure sensor 1. For instance, these can serve to measure the temperature of the immediate surroundings of the pressure sensor 1 to be able to anticipate and to compensate the effect of the temperature on the measurement electronics. Because the pressure sensor 1 is entirely arranged in the fluid tank and thus, in the to be measured medium, measurements of the temperature state of the tank content are also possible. Through suitable additional components, further state measurements, e.g. tank fill level or pH-value measurements can also be realized through the pressure sensor 1.

For mechanical protection and in particular for protection against attacks of aggressive fluids, the above described on the board 3 mounted components with an exception of the electrical contacts 17 are enclosed by a capper 21. The capper 21 consists of a material which is chemically resistant to the fluid with which the pressure sensor comes into contact. In the described embodiment polyoxymethylene is used which is characteristic of a very good hardness, stiffness and stability, and in particular of a good chemical resistance as well as good electrical insulator properties. Alternatively, other plastics or metals can also be for the capper 21.

Depending on the material of the capper 21, this is to be mounted on the board 3 by gluing or soldering, wherein to achieve a good and endurable adhesive strength of the capper 21, the surfaces of the capper 21 and/or the board 3 that are to be glued or soldered together are pre-treated in a suitable manner. An alternative, purely mechanically operating connection between the board 3 and the capper 21 is possible through a latching 31. Thereby, a mechanical connection which at the same has the required tightness is created through corresponding contours at both of the surfaces that are to be connected with each other.

In the presented embodiment, the capper 21 is presented segmented, i.e. the through the capper 21 above the board 3 formed cavity has at least two chambers, an inner cavity 23 and one encasing cavity 25 surrounding the inner cavity 23. Thereto, the capper 21 is segmented in a way and mounted on the board 3 such that the pressure sensing element 7 including the flexible electrical connector 15 and the integrated circuit 13 are placed in the inner cavity 23, and the electronic components 19 are placed outside of it but still in the encasing cavity 25. The electrical contacts 17 are outside of the capper 21.

The segmentation of the capper 21 takes place through a frame 27 which surrounds the pressure sensing element 7 inclusive of the flexible electrical connectors 15 and the integrated circuit 13 as close as possible. The frame 27 is connected with the board 3 by gluing. Alternatively, the frame 27 can also be connected with the capper 21, and together with the capper 21 glued on the board 3. This embodiment is in particular chosen if the height of the frame 27 is consistent with the height of the inner capper cavity. Through the dual-stage cavities 23, 25, a staggered protection of the pressure sensing element 7 and the integrated circuit in regards to the joint between capper 21 and board 3 is created. In this way even with leaks in the outer case, the capper 21 and with a pressure sensor 1 submerged in an aggressive fluid, the pressure sensing element 7 and the electronics are protected.

Because of the dual-stage protection, the frame 27 arranged inside the capper 21 can consist of a different material than the exterior of the capper 21 which forms the outermost encasing and thus, can come in contact with the fluid or its vapors. Alternatively, the capper 21 inclusive of the segmented parts such as the frame 27 can also be formed of the same material and of one piece.

Figure 1B:
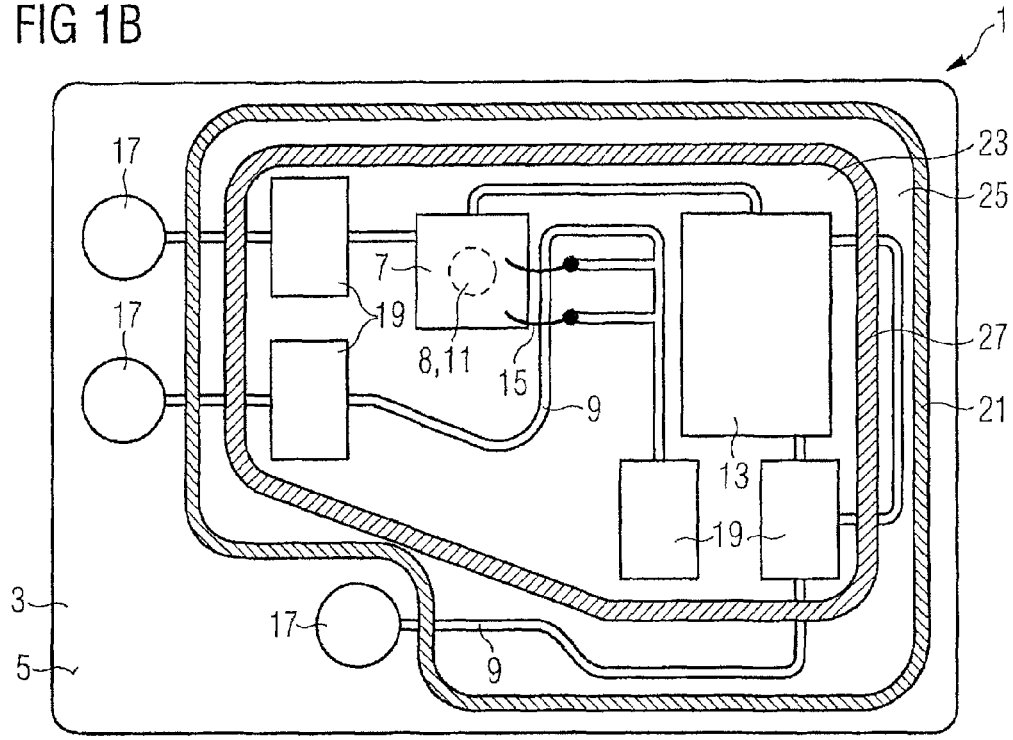

The dual, staggered protection is realized in FIG. 1A merely for the pressure sensing element 7 and the integrated circuit 11. Further electrical components 19 are merely protected by the capper 21. Alternatively, these components 19 can also be arranged in the inner cavity 21 (FIG. 1B). For a further construction of the pressure sensor 1 according to FIG. 1B, it is referred to the description as for FIG. 1A.

The conductor paths 9 and as well the electrical contacts 17 of the pressure sensors 1 according to FIGS. 1A and 1B can be produced through methods and with materials common in semiconductor technology wherein the electrical contacts 17 and at least the parts of the conductor paths 9 which contact the electrical contacts 17 and which in the presented embodiment are also outside of the capper 21 have to have the required chemical resistance in regards to the possible fluid contact. In the presented embodiment, the conductor paths 9 are formed as thick-film structures and are covered with its entire surface with exception of the respective contacts for the electronic components 7, 13, 15, 17, 19 on the board 3 by a protective layer 10, in this instance glass. Depending on the complexity of the circuitry of the pressure sensor 1, the conductor paths 9 can also be realized on several levels in a multilayer board 3, or for protection on an inner, covered layer of the board 3.

Figure 2A:
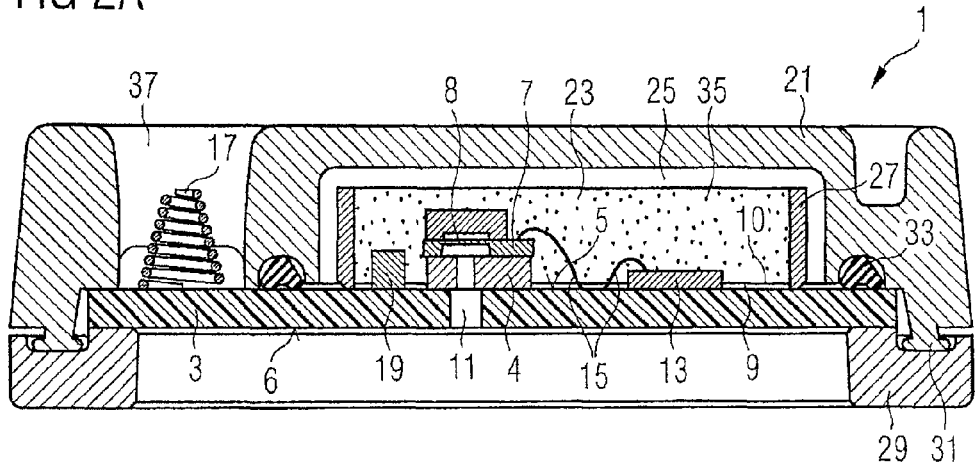

Another embodiment of the pressure sensor 1 is presented in a vertical, i.e. vertical to the board 3, cross section in FIG. 2A. In this embodiment, the board 3 is held by a enclosing 29 which leaves the rear side 6 of the board 3 almost completely free, so that a fluid can be applied to the pressure passage 11.

As above according to FIG. 1A, the pressure sensing element 7, here directly via a socket 4, the integrated circuit 13, the conductor paths 9 with protective layer 10, the electrical contacts 17, further electronic components 19 and the flexible electrical connectors for an electrical connection between these components are arranged on the board 3. These components except the electrical contacts are surrounded by a frame 27 and a capper 21, wherein the capper 21 encases the frame 27 inclusive of said components and thus, forms the encasing cavity 25.

By means of an elastic contour seal 33 which is inserted between the capper 21 and the board 3, and which has a shape of a ring with a contoured cross-section, in connection with a mechanically operating latching 31, the capper 21 is connected with the enclosing 29 in a way that a tightness resistant to a fluid is guaranteed. The latching 31 can be fitted permanently e.g. through laser welding.

The frame 27 has in FIG. 2A a height which is lower than the interior height of the capper 21. It is filled permanently up to its upper rim with a filling 35 made of a gel-like material, so that the frame 27 and the volume of the filling 35 form the inner cavity 23. Alternatively to the partial filling of the capper 21, the capper 21 can also be filled completely with the filling 35. Thereby, the frame 27 can be omitted, so that the filling 35 forms the second and interior stage of the dual-stage protection, and for that, has the required resistance. In further alternative embodiments, the protection has more than two stages, as e.g. the inner cavity 23 is also closed and contains a filling 35. Complementary or alternatively, the encasing cavity 25 can also have a filling 35.

For fillings, materials are considered which do not interfere with the functionality of the pressure sensing element 7 and of the integrated circuit 13 as well as further possibly in the encasing cavity 25 arranged components. That can be depending on the realization of the one or more cavities solid, also dispersible or hardened, liquid or gel-like materials. Considered are both suitable plastics and e.g. oil.

These fillings serve firstly the mechanical and in particular chemical protection of the components within the filling against the pressure sensor 1 surrounding fluid, but can also make the handling of the pressure sensor 1 easier during its production.

By means of the electrical contacts 17 which are outside of the capper 21, the completely enclosed and as a compact unit, inclusive of the signal processing, prefabricated pressure sensor 1 can be electrically contacted. In FIG. 2A, the electrical contacts 17 are realized as flexible contacts, e.g. as spring contacts. Also contacts made of elastic and electrically conductive material are alternatively possible. The electrical contacts 17 are realized in troughs of the capper 21, so that through this optionally a mechanical fixation can take place.

Figure 2B:
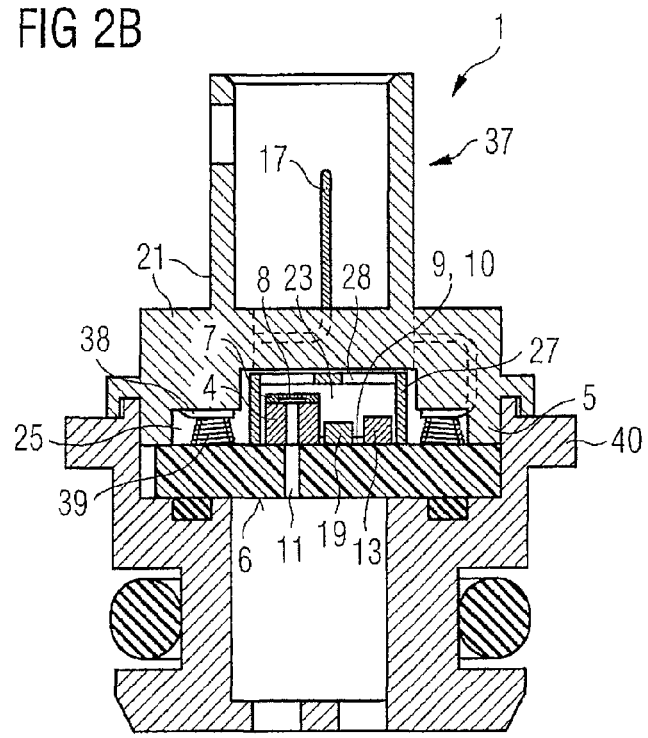

An embodiment of the electrical contacts 17 is presented in FIG. 2B. There, the electrical contacts 17 are realized as a plug contact 37 at the capper 21, and are led via a conduit through the capper 21 to the inner contact pads 38. Touching these are inner contacts 39 which are realized on the board 3, and inside the capper 21. Via the conductor paths 9, these are electrically connected in the capper 21 with the pressure sensing element 7, the integrated circuit 13 and the other electronic components 19 using electrical connectors 15.

According to FIG. 2B, the pressure sensing element 7, the integrated circuit 13 and the other electronic components 19 are arranged inside the frame 27 and the inner cavity 23, and the inner contacts 39 outside. The inner cavity 23 is formed by a the board 3 opposite and on the frame 27 fitted lid 28. Complementary, one of the cavities 23, 25 or both can have a filling as described above.

The tight connection of the capper 21 with the board 3 takes place through a pressure port 40 which is positively-fitted or through gluing connected with the capper 21, and thereby, fixates the board 3 inside a hollow cavity formed at the same time. The housing plug 4, is on the capper 21 opposite side open, and thus, leaves a part of the rear side 6 of the board 3 and the pressure passage 11 free.

With the in FIG. 3 presented installation situations (a), (b), (c) of one of the above described pressure sensors 1 in a fluid tank 43, its location (using the to the fluid 50 open pressure passage 11 of the pressure sensor 1), its mechanical and electrical connection are schematically presented, and the effect of the to be measured pressures p1, p2 are presented using arrows. The fluid tank 43 can consist of plastic or metal.

In all of the presented installation situations (a), (b), (c), the pressure sensor 1 is consistently installed inside the fluid tank 43 in a way that it is completely surrounded by the fluid 50. It is understood that the presentation for the purpose of a better overview takes place in one single fluid tank 43, and does not need to occur in a tank in all three situations.

In the first, designated as (a), installation situation, the pressure sensor 1 is fixated at the tank housing 45 using a mechanical holder 51. From the electrical contacts 17 of the pressure sensor 1, a cable 52 resistant to the fluid 50 is extended to a tank plug 54 which is mounted on the tank housing 45, alternatively also on a tank flange 47 of the tank housing 45, and which is suitable for an electrical connection to an external, i.e. measurement unit (not shown) arranged outside of the fluid tank 43. The pressure p1 in the fluid 50 acts on the pressure sensor element (not shown) via the pressure passage 11.

Alternatively depending on an embodiment of the electrical contacts 17, the electrical contacting and at the same time, a mechanical fixation can take place. This arrangement is presented in installation situation (b). For this purpose, a holder, here realized as tank plug 54, which has besides the counter-contacts corresponding to the electrical contact 17 at the same time a mechanical holder, is mounted directly or indirectly (presented in FIG. 3) via a tank flange 47 on the wall of the tank housing 45 in the fluid tank 43. Both functions can be realized by one single component, e.g. a suitable plug contact or mechanical holders combined with flexible contacts. The pressure conditions are similar to the ones of the installation situation (a).

The installation of the pressure sensor 1 in a complex tank component is presented on an example of a delivery module 49 in the installation situation (c). With this or another fluid tank assembly which separates a sub-volume inside the fluid tank, other measurements apart from a measurement of the tank's internal pressure is possible with a pressure sensor 1 inside the fluid tank 43. Thereby, the pressure sensor 1 is either entirely inside a pressurized chamber deviating from the internal pressure of the tank which is designated in FIG. 3 as p2, or only partially, so that only the pressure passage 11 of the pressure sensor 1 is exposed to p2. The other side is exposed to the tank's internal pressure. Both sides of the sensor are always completely surrounded by liquid or gaseous fuel. The delivery module 49 according to FIG. 3 is mounted on a tank flange 47, and can be removed from the fluid tank 43 with such. Here, the pressure sensor 1 is arranged in the delivery module 49 in a way that it measures the pressure p2 inside the module, e.g. the pressure of the tank following the pump (not shown) and also following the filter (not shown) of the delivery module 49. The mechanical and electrical connection of the pressure sensor 1 in the delivery module 49 can take place as described above for the installation in the fluid tank 43. The electrical connection to a, e.g. tank plug 54 arranged at the tank flange 47 takes place again using a cable 52.

For positioning, holding and electrically contacting, in the presented installation situations (a), (b), (c) can be realized alternatively for a detachable or a permanent connection, the latter e.g. through soldering. In the first instance, the counter-contacts are realized through e.g. contacts pads or contact bumps against which the electrical contacts 17, e.g. the spring contacts of the pressure sensor 1, or cable contacts are directly pressed. The realization of the electrical contacts 17 as flexible contacts respectively to the in FIG. 2A presented embodiment of the pressure sensor 1 guarantees a reliable electrical contact with producing the mechanical fixation. Also, the separate mechanical connections to the tank housing 45, to the tank flange 47 or at the delivery module 49 can as described above be realized detachable, e.g. with a plug contact or a clamp or alternatively, as a permanent connection.

Originating from these holders, the electrical leads are to be extended only from the inside of the fluid tank to the outside. For feeding through the electrical leads, e.g. enclosed lead passages or counter-contacts pressed into the wall of the tank can be used.

Thus, it is possible to install the pressure sensor 1 at nearly any location of the fluid tank 43 inside the fluid or above the fluid level, or to place it in the middle of the fluid tank 43 using suitable holders. The installation as a compact component, e.g. using mechanical and electrical plugs also simplifies the replacement of the pressure sensor 1 for maintenance.

The invention claimed is:

1. Pressure sensor for measuring pressure of a fluid, comprising:
   a board with a pressure passage open on one side of the board and closed on an other side by a board mounted pressure sensing element, the sensing element comprising a sensor chip, the one side of the board being exposed to the fluid,
   electrical contacts arranged on the board for electrical contacting of the pressure sensor,
   a board mounted integrated circuit for processing and forwarding of electrical signals of the pressure sensing element electrically connected with the pressure sensing element and at least one of the electrical contacts,
   a capper tightly connected with the board, so that at least the pressure sensing element and the integrated circuit are tightly enclosed by the capper, the capper being exposed to the fluid and comprising a material chemically resistant to the fluid, and
   supplemental means providing chemically resistant protection against the fluid at least of the pressure sensing element and the integrated circuit, wherein the supplemental means is arranged in an encasing cavity formed by the capper and the board.

2. Pressure sensor according to claim 1, wherein said supplemental means for the protection at least of the pressure sensing element and the integrated circuit comprises an at least partial filling of the encasing cavity with a solid, liquid or gel-like material chemically resistant to the fluid.

3. Pressure sensor according to claim 1, wherein the capper is realized in a segmented way, so that the pressure sensing element and the integrated circuit are enclosed in an inner cavity which is surrounded by the encasing cavity.

4. Pressure sensor according to claim 3, wherein a frame is arranged in the encasing cavity and forms the inner cavity, and outside of the inner cavity another electronic component is arranged which is electrically connected with the integrated circuit and/or the pressure sensing element and an electrical contact of the pressure sensor.

5. Pressure sensor according to claim 1, wherein electrical connections between the electrical contacts and the pressure sensing element or the integrated circuit comprise structured conductor paths formed on the board on at least one level and the conductor paths are covered by a protective layer made of glass.

6. Method of using a pressure sensor according to claim 1 in a fluid tank which serves for storage and transport of the fluid, wherein the pressure passage is open on a side facing an interior of the tank, and the capper is exposed to the fluid.

7. Fluid tank for storage and transport of a fluid, comprising:
   a tank housing for intake of a fluid;
   a pressure sensor according to claim 1 for measuring the pressure in the fluid tank, wherein the pressure passage in the board of the pressure sensor is open on a side facing an interior of the tank,
   wherein the pressure sensor is arranged completely in the fluid tank.

8. Fluid tank according to claim 7, wherein the pressure sensor in the fluid tank is arranged using a holder which mechanically fixates and electrically contacts the pressure sensor.

9. Fluid tank according to claim 7, wherein the tank housing of the fluid tank has an opening closable by a tank flange, and the pressure sensor is attached to the tank flange.

10. Fluid tank according to claim 7, wherein the pressure sensor is arranged at an assembly separate from the fluid tank in a way that the pressure sensor is arranged completely in the fluid tank.

11. Fluid tank assembly comprising a fluid tank in combination with a pressure sensor according to claim 1, wherein at least the one side of the board, the pressure passage and the capper are exposed to the fluid in the fluid tank.

* * * * *